United States Patent [19]

Nagai et al.

[11] Patent Number: 5,130,680
[45] Date of Patent: Jul. 14, 1992

[54] LADDER-TYPE ELECTRIC FILTER

[75] Inventors: Takesumi Nagai; Shoji Shimizu, both of Aichi, Japan

[73] Assignee: NGK Spark Plug Co., Ltd., Aichi, Japan

[21] Appl. No.: 676,521

[22] Filed: Mar. 28, 1991

[30] Foreign Application Priority Data

Mar. 30, 1990 [JP] Japan .................. 2-86598

[51] Int. Cl.$^5$ .......................................... H03H 9/00
[52] U.S. Cl. ..................... 333/189; 333/188; 310/312
[58] Field of Search ............... 333/187, 188, 189, 190, 333/191, 192; 310/312, 367, 368

[56] References Cited

U.S. PATENT DOCUMENTS

| | | | |
|---|---|---|---|
| 4,639,698 | 1/1987 | Nishiki | 333/189 |
| 4,641,055 | 2/1987 | Tanaka | 310/312 |
| 4,649,310 | 3/1987 | Nakamura | 310/312 |
| 4,812,697 | 3/1989 | Mishiro | 310/312 |
| 4,837,533 | 6/1989 | Oshikawa | 333/189 |
| 4,864,259 | 9/1989 | Takamoro | 333/189 |

*Primary Examiner*—Eugene R. LaRoche
*Assistant Examiner*—A. Zarahian
*Attorney, Agent, or Firm*—Finnegan, Henderson, Farabow, Garrett and Dunner

[57] ABSTRACT

A small ladder-type electric filter for use in radio equipment or the like, includes a casing, a plurality of resonators having a small mechanical quality coefficient and a frequency constant, and a plurality of resonators having a large mechanical quality coefficient. The small mechanical quality coefficient resonators and the large mechanical quality coefficient resonators being combined in series-parallel to each other. The external size of the large mechanical quality coefficient resonators is substantially equal to the external size of the small mechanical quality coefficient resonators. A plurality of terminal plates hold the plurality of small and large mechanical quality coefficient resonators in the casing. Slits are selectively formed in side edges of each of the plurality of large mechanical quality coefficient resonators for adjusting the resonance frequency of the large mechanical quality coefficient resonators to a predetermined resonance frequency. Therefore, the size of the casing can be determined in accordance with the frequency constant of the small mechanical quality coefficient resonators.

4 Claims, 4 Drawing Sheets

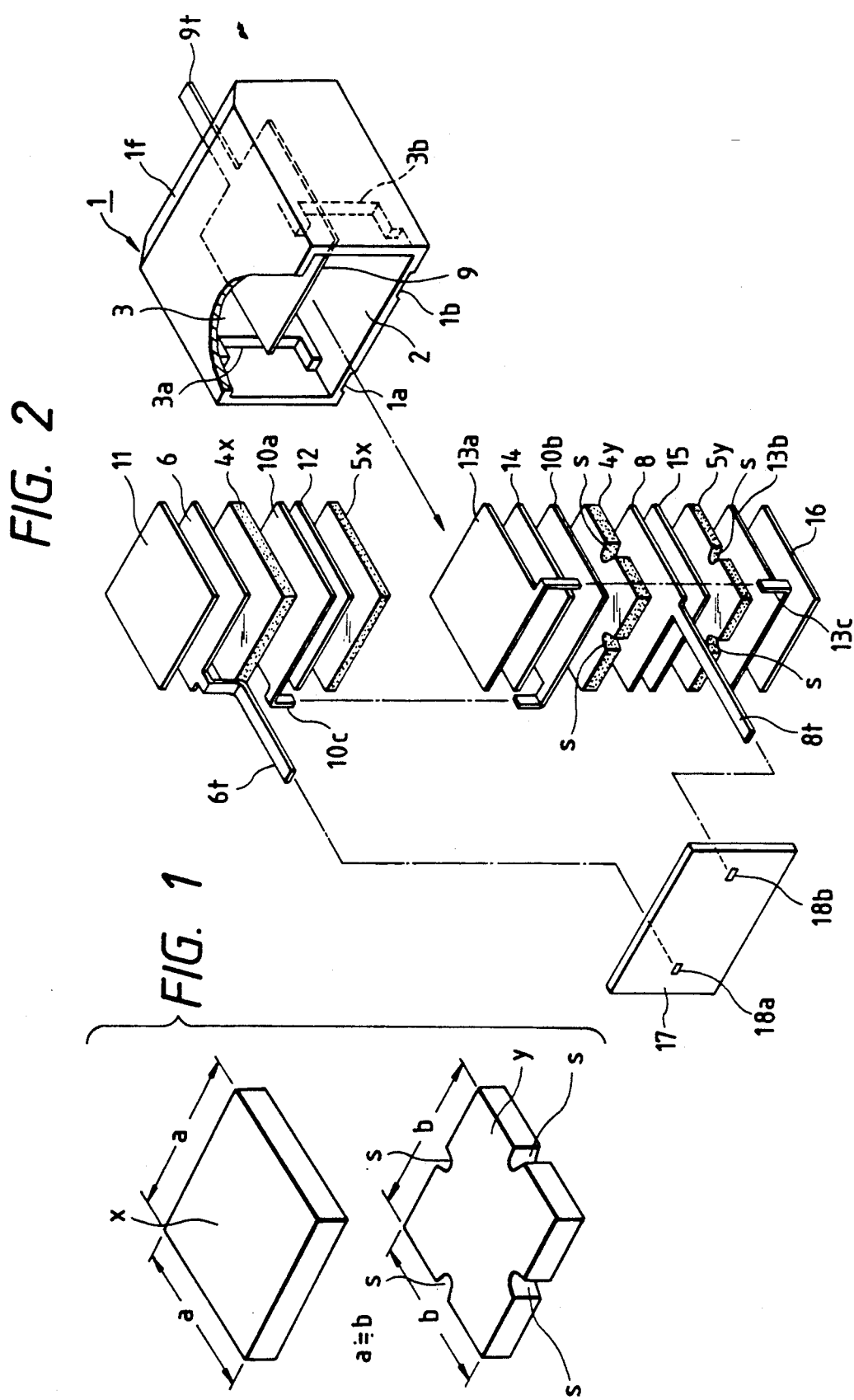

| SAMPLE | 1 | 2 | 3 | 4 |
|---|---|---|---|---|
| COMBINATION | x y / x y | x x / x x | y y / y y | y x / y x |
| RESULT — AMPLITUDE (3dB) | GOOD (9.26) | GOOD (8.92) | GOOD (9.68) | ACCEPTABLE (8.72) |
| RESULT — ATTENUATION | GOOD (3.25dB) | INFERIOR (4.61dB) | VERY GOOD (1.73dB) | GOOD (3.45dB) |
| RESULT — ±6.25 KHz | GOOD | INFERIOR | VERY GOOD | GOOD |
| RESULT — GROUP DELAY | GOOD | VERY GOOD | INFERIOR | GOOD |

LADDER-TYPE ELECTRIC FILTER

BACKGROUND OF THE INVENTION

1. Field of the Invention

The present invention relates to a ladder-type electric filter for use in radio equipment or the like, in which a plurality of piezo resonators are combined in series-parallel to each other.

2. Description of the Related Art

The ladder-type electric filter of the kind described above has a configuration of thick and large-capacity series resonators, thin and small-capacity parallel resonators, and a plurality of terminal plates for electrically, mechanically holding the series and parallel resonators therebetween in a casing, as shown in FIGS. 5 and 6.

Such filters are used in filter circuits of various radio communication equipment, and particularly, when such a filter is used in mobile radio equipment of the phase modulation system type, such as a land mobile radiotelephone, a pocket pager, or the like. This filter is required to be superior in group delay characteristics, in addition to the conventional amplitude characteristics.

Conventionally, in order to respond to the foregoing requirements, the group delay characteristics of the improved ladder-type filter have been promoted by using resonators formed of piezo-ceramics having a small mechanical quality coefficient Qm (hereinafter, simply referred to as a "Qm"). However, there has been a disadvantage in that the insertion loss of the ladder-type electric filter remarkably increases in comparison with a ladder-type electric filter using large Qm resonators.

Small Qm piezo-ceramics resonators x and large Qm piezo-ceramics y have been combined with each other to form a predetermined ladder-type circuit.

FIG. 7 shows the characteristics of various ladder type electric filters in which small Qm resonators x and large Qm resonators y which are combined in series-parallel to each other.

Here, sample 1 was such that small Qm resonators x were disposed in series-parallel to each other at the input side and large Qm resonators v were disposed in series-parallel to each other at the output side, as will be shown later in an embodiment of the invention; sample 2 was such that only the small Qm resonators y were disposed in series-parallel to each other; sample 3 was such that only the large Qm resonators x were disposed in series-parallel to each other; and sample 4 was such that the large Qm resonators v were disposed in series-parallel to each other at the input side and the small Qm resonators y were disposed in series-parallel to each other at the output side.

Amplitude characteristics were judged on the basis of the frequency band width at the position where the frequency was lowered from the center frequency by 3 dB. In view of the fact that the frequency is required to have a predetermined value as to the amplitude characteristics, all the samples may be used with no trouble, although sample 4 is slightly inferior to the others. The insertion loss is large in sample 2. Further, when a large-capacity system is used in a land mobile radiotelephone, the frequency band width of 12.5 kHz is given to every radio channel and, therefore, the attentuation characteristics in a range of ±6.25 kHz from the center frequency were examined. As a result, it was found that sample 2 was inferior. Moreover, the group delay characteristics were examined, and it was found that sample 3 was inferior.

When the results were comprehensively judged, it was found that all the values were good in sample 1 and therefore, sample 1 was the most suitable for the filter circuit of a land mobile radiotelephone. Further, it was found that sample 4 could be used.

It was also found that when the ladder-type electric filter in which small Qm resonators x and large Qm resonators y are combined with each other as described above, superior group delay characteristics occur making the filter suitable for a mobile radiotelegraph of the phase modulation system.

When large Qm series or parallel resonators and small Qm series or parallel resonators are combined with each other as described above, there is an advantage in that an increase of the insertion loss is suppressed by the large Qm resonators v and the group delay characteristics are improved by the small Qm resonators x, so that a low insertion loss and good group delay characteristics are realized as a whole. However, the frequency constant of the large Qm resonator y is large, and in order to satisfy the relation of "frequency constant = frequency X length" it is, therefore, necessary to select the external size b of the large Qm resonators y to be larger than the external size a of the small Qm resonators x, as shown in FIG. 6. For example, when the Qm of a resonator in which contour oscillation is generated at the resonance frequency of 455 kHz is 200, the frequency constant of the resonator is 1950, and the external size obtained through the foregoing expression is therefore, 4.5 mm$^2$. In the case of a resonator having a Qm of 600, on the other hand, the frequency constant is 2150, and the external size is therefore, 4.8 mm$^2$. Consequently, there arises a new problem in that it is necessary to design the internal size of a casing for housing the resonators having the foregoing external sizes so as to suit the external size of the large Qm resonator. Therefore, the shape of the casing becomes large and it is difficult to use the casing in thin mobile radio equipment. This poses difficulties when reduction in size, weight, and thickness of radio equipment are desired. Pocket telephones, etc., with the above desired properties are in high demand.

SUMMARY OF THE INVENTION

An object of the present invention is, therefore, to miniaturize a ladder-type electric filter in which series or parallel small Qm resonators and series or parallel large Qm resonators are combined with each other.

To achieve the objects and in accordance with the purposes of the invention, as embodied and broadly described herein, the ladder-type electric filter comprises a casing, a plurality of resonators having a small mechanical quality coefficient and a frequency constant, and a plurality of resonators having a large mechanical quality coefficient. The small mechanical quality coefficient resonators and the large mechanical quality coefficient resonators being combined in series-parallel to each other. The external size of the large mechanical quality coefficient resonators is substantially equal to the external size of the small mechanical quality coefficient resonators. A plurality of terminal plates hold the plurality of small and large mechanical quality coefficient resonators in the casing. Slit means are selectively formed in side edges of each of the plurality of large mechanical quality coefficient resonators for adjusting the resonance frequency of the large mechanical quality coefficient resonators to a predetermined resonance frequency, so that the size of the casing can be determined in accordance with the frequency constant of the small mechanical quality coefficient resonators.

Additional objects and advantages of the invention will be set forth in part in the description which follows and in part will be obvious from the description or may be learned by practice of the invention. The objects and advantages of the invention may be realized and attained by means of the instrumentability and combinations particularly pointed out in the appended claims.

BRIEF DESCRIPTION OF THE DRAWINGS

The accompanying drawings, which are incorporated in and constitute a part of the specification, illustrate the embodiments of the invention and, together with the description, serve to explain the objects, advantages and principals of the invention.

FIG. 1 is a perspective view showing the small Qm resonator x and the large Qm resonator v of the present invention;

FIG. 2 is an exploded perspective view showing the electric filter F of the present invention;

FIG. 7 is a table illustrating characteristics of electric filters of various combinations.

DESCRIPTION OF THE PREFERRED EMBODIMENT

Figure 3:
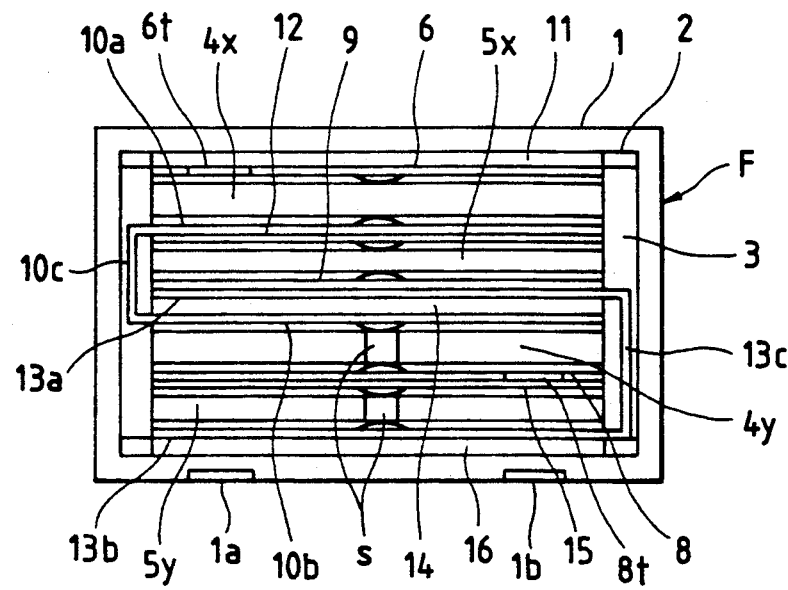
FIG. 3 is a front view of the filter of the present invention.

The present invention is applied to a filter F having four resonators housed in a casing so as to constitute a fundamental unit circuit will be described with reference to FIGS. 1 and 4 of the accompanying drawings.

The present invention has a feature in that the external size b of large Qm resonators v is selected to be smaller than the size determined on the basis of the frequency constant so as to be substantially equal to the external size a of small Qm resonators x. Slits s for adjusting the resonance frequency to a predetermined once, are partially formed in the side edges of the large Qm resonators y, as shown in FIG. 1.

If the external size b of the large Qm resonators y is selected to be smaller than the size determined on the basis of the frequency constant, the resonance frequency becomes higher than the original one by tens of kHz. If slits are partially formed in the side edges of the large Qm resonators v, on the other hand, the resonance frequency is lowered. Then, if the external size b of the large Qm resonators y is decreased so as to be substantially equal to the external size a of the small Qm resonators x and an increase of the frequency is decreased by adjusting the number and depth of the slits partially formed in the side edges, the resonance frequency can be adjusted to the original one. In the drawings, reference numeral 1 designates a thin rectangular synthetic resin casing of an insulating material in which earth terminal plate 9, having connecting leg 9t formed to project from one end edge of earth terminal plate 9, is integrally incorporated in the casing through insert-molding or the like.

Various members for constituting a required circuit are inserted above and under the earth terminal plate 9 from opening surface 2 into housing space 3 of synthetic resin casing 1. The configuration of the housed members will be described with reference to FIGS. 1-3.

First, buffer plate 11, input terminal plate 6 having a connecting leg 6t provided at one side edge, thick series resonator 4x having a small Qm, relay terminal plate 10a, auxiliary terminal plate 12, and thin parallel resonator 5x having a small Qm are successively inserted above earth terminal plate 9.

Further, relay terminal plate 13a, insulating plate 14, relay terminal plate 10b, thick series resonator 4y having a large Qm, output terminal plate 8 having a connecting leg 8t provided at one side edge, auxiliary terminal plate 15, thin parallel resonator 5y having a large Qm, relay terminal plate 13b, and buffer plate 16 are successively inserted below the earth terminal plate 9.

The relay terminal plates 10a and 10b are integrally connected to each other at their side front portions through connecting portion 10c.

Similarly, relay terminal plates 13a and 13b are integrally connected to each other at their side rear portions through connecting portion 13c. Notch portions 3a and 3b are formed at the opposite sides of the inlet portion so that connecting portions 10c and 13c are located in notch positions 3a and 3b in housing space 3 of synthetic resin casing 1, so that connecting portions 10c and 13c do not come into contact with other members.

In such a housing arrangement, connecting legs 6t and 8t of input and output terminal plates 6 and 8 are projected from the other side surface of synthetic resin casing 1.

Sealing plate 17 is fitted through opening surface 2, as shown in FIG. 3. Connecting legs 6t and 8t are inserted through insertion holes 18a and 18b of sealing plate 17 so as to project sideward, as shown in FIG. 2. Sealing agent 19, such as epoxy resin or the like, is poured onto sealing plate 17 to thereby complete the ladder-type electric filter F.

In the foregoing configuration, the external size of each of large Qm resonators 4y and 5y is selected to be substantially equal to the external size of each of small Qm resonators 4x and 5x. Slits s are formed in central portions of the side edges of each of resonators 4y and 5y so as to adjust the resonance frequency to a predetermined one. The Qm of each of resonators 4y and 5y is larger than that of each of resonators 4x and 5x, and it is, therefore, necessary to select the external size of each of resonators 4y and 5y from the relation "frequency constant=frequency X length" on the basis of the frequency constant being larger than the external size of each of resonators 4x and 5x. The resonance frequency is lowered by the slits s and, therefore, even when the external size of each of large Qm resonators 4y and 5y is selected to be substantially equal to that of each of small Qm resonators 4x and 5x, cancellation is performed, so that the resonance frequency is kept to a required one. Consequently, although resonators 4x, 5x, 4y and 5y differ in Qm from each other, all are housed in casing 1. The size of casing 1 can be set on the basis of the predetermined size determined in accordance with the frequency constant of small Qm resonator 4x and 5x. Therefore, the ladder-type electric filter of the kind described above can be reduced in size.

Figure 4:
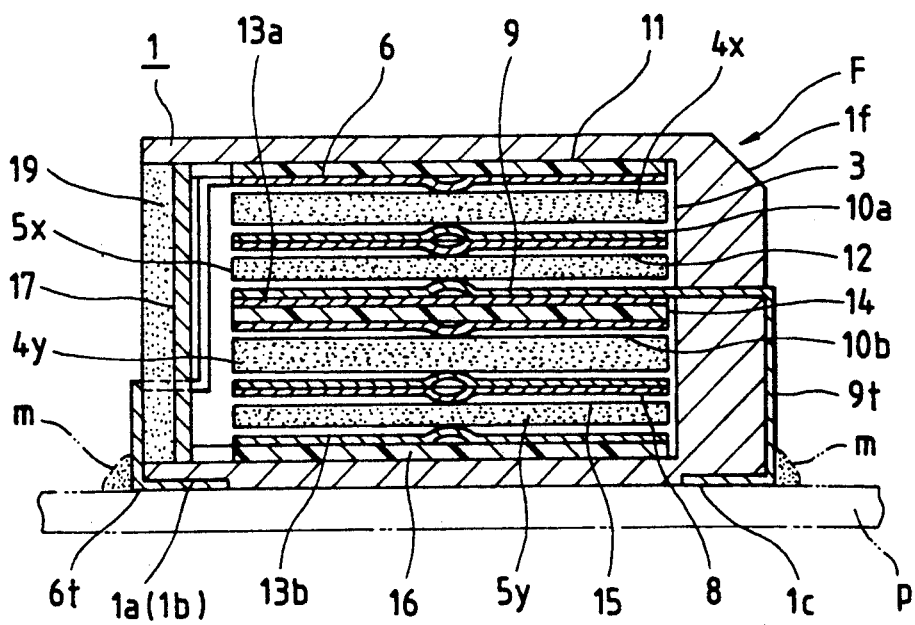
FIG. 4 is a longitudinal sectional side view of the filter of the present invention.

Electric filter F, having a configuration described above, is laid on printed substrate p, and end portions of connecting legs 6t, 8t and 9t provided on the lower surface of synthetic resin casing 1 are connected to required conductive paths on the printed substrate p by soldering m, as shown in FIG. 4.

Figure 5:
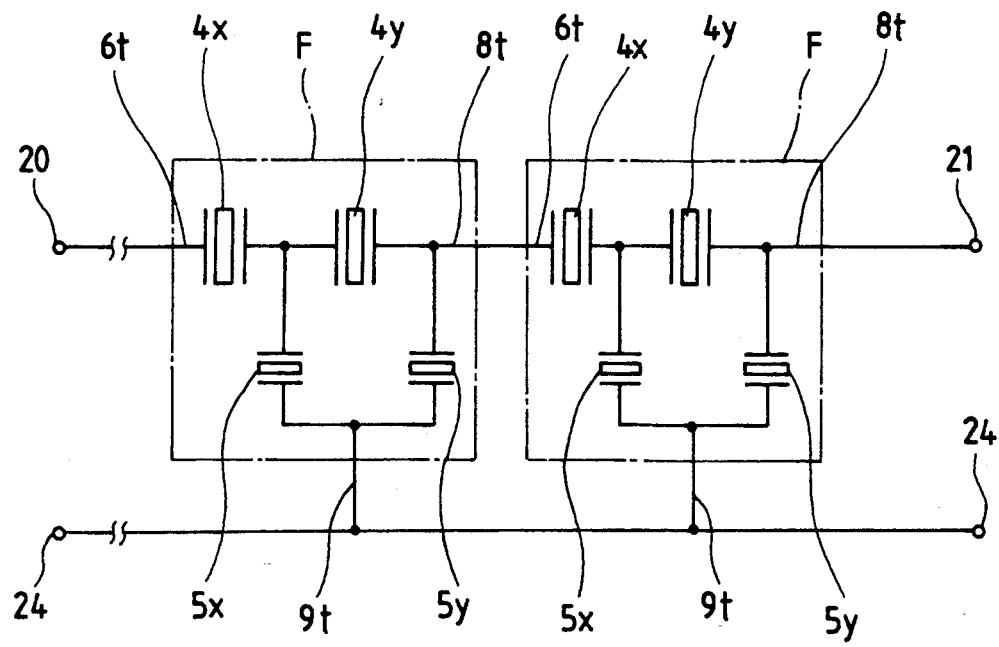
FIG. 5 is a diagram of the filter circuit to which the electric filter F is applied.
Figure 6:
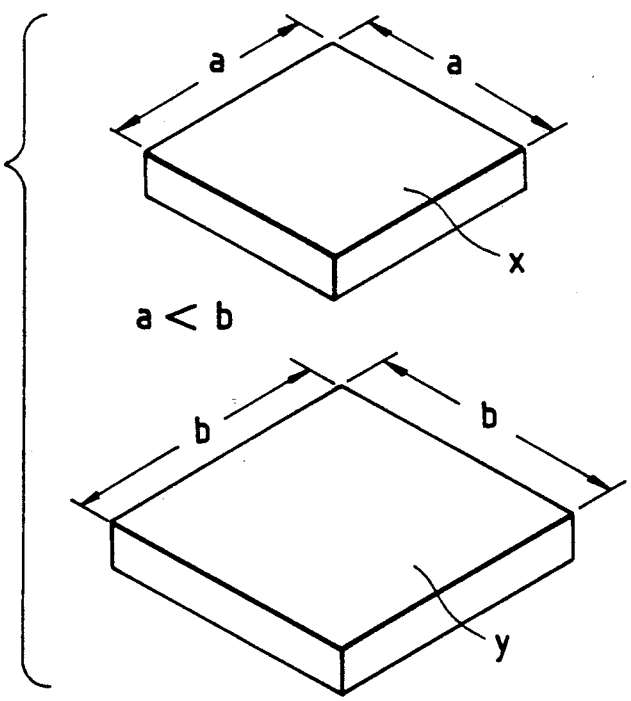
FIG. 6 is a perspective view of conventional small Qm resonator x and large Qm resonator y.

Electric filter F functions as a fundamental unit circuit of a filter circuit, and if a multistage filter circuit, as shown in FIG. 5 is to be formed, the plurality of filters F may be cascade-connected to each other.

As described above, according to the present invention, slits s are formed in the side edges of large Qm resonators y so that it is possible to obtain a required resonance frequency even when the size of resonators y is selected to be substantially equal to that of small Qm resonator x. Therefore, the shape of small Qm resonator x is made substantially the same as that of the large Qm resonator v. Consequently, since the internal size of the casing may be suited to the external size of the Qm resonators, the shape can be made small in comparison with the conventional products in which the internal size of a casing has to be suited to the external size of large Qm resonators. Therefore, the present invention can be applied to mobile radio equipment, which is small both in size and in thickness. Furthermore, the large Qm resonators and the small Qm resonators can be tightly housed in the casing with no gaps, because the external size of the former is substantially equal to that of the latter. Moreover, it is possible to provide a filter which has improved vibration-proof and shock-resistance properties.

Other embodiments of the invention will be apparent to those skilled in the art from the consideration of the specification and practice of the invention disclosed herein. It is intended that the specification be considered exemplary only, with a true scope and spirit of the invention being indicated by the following claims.

What is claimed is:

1. A ladder-type electric filter comprising:

a casing;

a plurality of thin resonators having a small mechanical quality coefficient, said small mechanical quality coefficient resonators having a frequency constant;

a plurality of thick resonators having a large mechanical quality coefficient, said small mechanical quality coefficient resonators and said large mechanical quality coefficient resonators being combined in series-parallel to each other, said large mechanical quality coefficient resonators and said small mechanical quality coefficient resonators having substantially equal external sizes;

a plurality of terminal plates for holding said plurality of small and large mechanical quality coefficient resonators in the casing; and slit means selectively formed in side edges of each of said plurality of large mechanical quality coefficient resonators for adjusting the resonance frequency of said large mechanical quality coefficient resonators to a predetermined resonance frequency, so that the external size of said large mechanical quality coefficient resonators and the size of the casing can be determined in accordance with the frequency constant of said small mechanical quality coefficient resonators.

2. The ladder-type electric filter of claim 1, wherein the external size of the plurality of large mechanical quality coefficient resonators is determined by the relation; frequency constant = frequency × length.

3. The ladder-type electric filter of claim 1, further comprising a terminal earth plate disposed in said casing, at least one of said plurality of small mechanical quality coefficient resonators and at least one of said large mechanical quality coefficient resonators being disposed above said terminal earth plate, and at least one of said plurality of small mechanical quality coefficient resonators and at least one of said large mechanical quality coefficient resonators being disposed below said terminal earth plate.

4. The ladder-type electric filter of claim 2, wherein the frequency constant is larger than the external size of said small mechanical quality coefficient resonators.

* * * * *